(12) United States Patent
Chen et al.

(10) Patent No.: US 10,338,652 B2
(45) Date of Patent: Jul. 2, 2019

(54) HIGH VOLTAGE PROTECTION SYSTEM FOR ADJUSTING DUTY CYCLE BY USING PULSE WIDTH MODULATION SIGNAL

(71) Applicant: Prolific Technology Inc., Taipei (TW)

(72) Inventors: Wan-Yang Chen, Kaohsiung (TW); Chih-Shih Yang, Hsinchu (TW); Jia-Jun Liu, Hsinchu (TW)

(73) Assignee: Prolific Technology Inc., Taipei (TW)

( * ) Notice: Subject to any disclaimer, the term of this patent is extended or adjusted under 35 U.S.C. 154(b) by 460 days.

(21) Appl. No.: 15/131,025

(22) Filed: Apr. 17, 2016

(65) Prior Publication Data

US 2016/0315466 A1 Oct. 27, 2016

(30) Foreign Application Priority Data

Apr. 23, 2015 (TW) ............................. 104113049 A
Dec. 9, 2015 (TW) ............................. 104141241 A (51) Int. Cl.
*G06F 1/26* (2006.01)
*G06F 1/28* (2006.01)
*H03K 7/08* (2006.01)

(52) U.S. Cl.
CPC .................. *G06F 1/26* (2013.01); *G06F 1/28* (2013.01); *H03K 7/08* (2013.01)

(58) Field of Classification Search
CPC ............... H02H 9/04; H03K 7/08; G06F 1/26
USPC ......................................................... 361/91.7
See application file for complete search history.

(56) References Cited

U.S. PATENT DOCUMENTS

| | | | |
|---|---|---|---|
| 4,996,466 A | 2/1991 | Su | |
| 5,339,009 A * | 8/1994 | Lai | ............................. G05F 1/00 307/10.8 |
| 7,271,559 B2 | 9/2007 | Peter | |
| 2004/0169968 A1 | 9/2004 | Mohr | |
| 2004/0264086 A1 | 12/2004 | Lin | |
| 2006/0181232 A1* | 8/2006 | Oljaca | ..................... G06F 1/206 318/268 |

(Continued)

FOREIGN PATENT DOCUMENTS

| | | |
|---|---|---|
| CN | 1592020 A | 3/2005 |
| CN | 101674044 A | 3/2010 |

(Continued)

OTHER PUBLICATIONS

Machine Translation of Taiwanese Patent Document TW 201308875 A, dated Feb. 16, 2013.*

(Continued)

*Primary Examiner* — Kevin J Comber
(74) *Attorney, Agent, or Firm* — Winston Hsu (57) ABSTRACT

A high voltage protection system includes a high voltage processing circuit, a pulse width modulation signal outputting circuit, a driving circuit, and a coil module. The high voltage processing circuit is used for receiving and processing a high voltage. The pulse width modulation signal output circuit is coupled to the high voltage processing circuit for generating a pulse width modulation signal. The driving circuit is coupled to the pulse width modulation signal outputting circuit for receiving the pulse width modulation signal and generating a driving voltage accordingly. The coil module is coupled to the driving circuit and is operated according to the driving voltage.

7 Claims, 6 Drawing Sheets

(56) References Cited

U.S. PATENT DOCUMENTS

2010/0066290 A1    3/2010   Ting
2010/0077237 A1*   3/2010   Sawyers .................. G06F 1/26
                                                                                713/300

FOREIGN PATENT DOCUMENTS

| CN | 201426038 Y | 3/2010 |
|----|----|----|
| CN | 104184110 A | 12/2014 |
| JP | S48-14730 | 4/1973 |
| JP | S59-92587 U | 6/1984 |
| JP | H03-273891 A | 12/1991 |
| JP | 2005513987 A | 5/2005 |
| JP | 2006-230180 A | 8/2006 |
| JP | 3125493 U | 9/2006 |
| TW | 511818 U | 11/2002 |
| TW | M272301 | 8/2005 |
| TW | 201308875 | 2/2013 |
| TW | 201332261 | 8/2013 |
| TW | 1451673 B | 9/2014 |

OTHER PUBLICATIONS

Machine Translation of Chinese Patent Document CN 104184110 A, dated Dec. 3, 2014.*
Machine Translation of Chinese Patent Document CN 1592020 A, dated Mar. 9, 2005.*

* cited by examiner

HIGH VOLTAGE PROTECTION SYSTEM FOR ADJUSTING DUTY CYCLE BY USING PULSE WIDTH MODULATION SIGNAL

CROSS REFERENCE TO RELATED APPLICATION

This application claims the benefit of Taiwan application no. 104113049 (filed on Apr. 23, 2015) and Taiwan application no. 104141241 (filed on Dec. 9, 2015), both included herein by reference.

BACKGROUND OF THE INVENTION

1. Field of the Invention

The present invention illustrates a high voltage protection system, and more particularly, the high voltage protection system for adjusting duty cycle by using pulse width modulation signal.

2. Description of the Prior Art

With the advancement of techniques, various electric devices with high operational performance are widely adopted. Nowadays, most electric devices are required to perform high processing speed and low response time in conjunction with a high-level processor integrated to a micro volume circuit. Thus, the electric devices can be operated by users anytime and in anyplace. For example, the specification of iPhone 5s uses an A7-typed processor. The specification of iPhone 6 Plus uses an A8-typed processor. Another example is that the central processing unit (CPU) of the personal computer is upgraded from Intel® Core™ i5 to Intel® Core™ i7. Specifically, power consumption and heat generation of the electric device are increased since the clock frequency of the processor is increased. Thus, the performance of heat dissipation components such as heat dissipation fans, a water cooling system, thermally conductive adhesive, and a heat sink attracts more attention. Among these heat dissipation devices, a water cooling system has the best heat dissipation performance yet has a large circuit volume, high cost, and high noise. Thermally conductive adhesives and heat sinks have smaller volume with inferior heat dissipation performance since they only use a medium for conducting heat. As a result, heat dissipation fans became the most popular devices for dissipating heat in general electric devices.

Generally, when the electric device is used, unstable voltage or an extremely high voltage pulse may be received by the electric device. For example, when the computer is used by a user, the voltage of the AC/DC source may be unstable because of lightning. When the notebook is used by a user, the voltage of the batteries may be unstable because the batteries are expired. When the electric device is activated by the user, a wrong voltage may be received since the user puts the plug in the wrong socket. Thus, two protection circuits are introduced in the conventional heat dissipation fan circuit in order to avoid the heat dissipation fan being damaged by the unexpected high voltage. The first protection circuit includes an over voltage protection circuit (OVPC). When the unexpected high voltage is received, the OVPC cuts the power of the fan circuit. Since operation of the fan circuit is paused due to the power cut, the fan circuit is protected. However, when operation of the fan circuit is paused, the fan circuit cannot perform heat dissipation. As a result, when the unexpected high voltage is received, the fan circuit with OVPC is paused, thereby leading to damage of device (i.e., CPU) which needs to dissipate heat since the function of heat dissipation is also paused. The second protection circuit includes a voltage regulator (VR). When the unexpected high voltage is received, the VR transfers the high voltage to a regular voltage for protecting the fan circuit. However, when the fan circuit is operated under large current, the power tolerance of VR has to be increased, thereby leading to a large circuit size of VR.

SUMMARY OF THE INVENTION

In an embodiment of the present invention, a high voltage protection system is disclosed. The high voltage protection system includes a high voltage processing circuit, a pulse width modulation signal outputting circuit, a driving circuit, and a coil module. The high voltage processing circuit is used for receiving and processing a high voltage. The pulse width modulation signal outputting circuit is coupled to the high voltage processing circuit for generating a pulse width modulation signal. The driving circuit is coupled to the pulse width modulation signal outputting circuit for receiving the pulse width modulation signal and generating a driving voltage accordingly. The coil module is coupled to the driving circuit and operated according to the driving voltage. The pulse width modulation signal outputting circuit generates the pulse width modulation signal to protect the coil module according to an intensity of the high voltage through the high voltage processing circuit.

Another embodiment of the present invention discloses a high voltage protection system. The high voltage protection system includes a high voltage processing circuit, a driving chip, and a coil module. The high voltage processing circuit is used for receiving a high voltage and generating a pulse width modulation voltage. The driving chip is coupled to the high voltage processing circuit for generating at least one driving voltage. The coil module is coupled to the driving chip and operated according to the at least one driving voltage. The driving chip generates the least one driving voltage to protect the coil module according to an intensity of the high voltage through the high voltage processing circuit.

Another embodiment of the present invention discloses a high voltage protection system. The high voltage protection system includes a voltage regulator, a high voltage processing circuit, a driving chip, and a coil module. The voltage regulator is used for receiving a high voltage and generating a step-down high voltage by reducing an intensity of the high voltage. A high voltage processing circuit is coupled to the voltage regulator for receiving and processing the step-down high voltage and generating a pulse width modulation voltage. The driving chip is coupled to the high voltage processing circuit for generating at least one driving voltage. The coil module is coupled to the driving chip and operated according to the at least one driving voltage. The driving chip generates the at least one driving voltage to protect the coil module according to the intensity of the high voltage through the voltage regulator and the high voltage processing circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
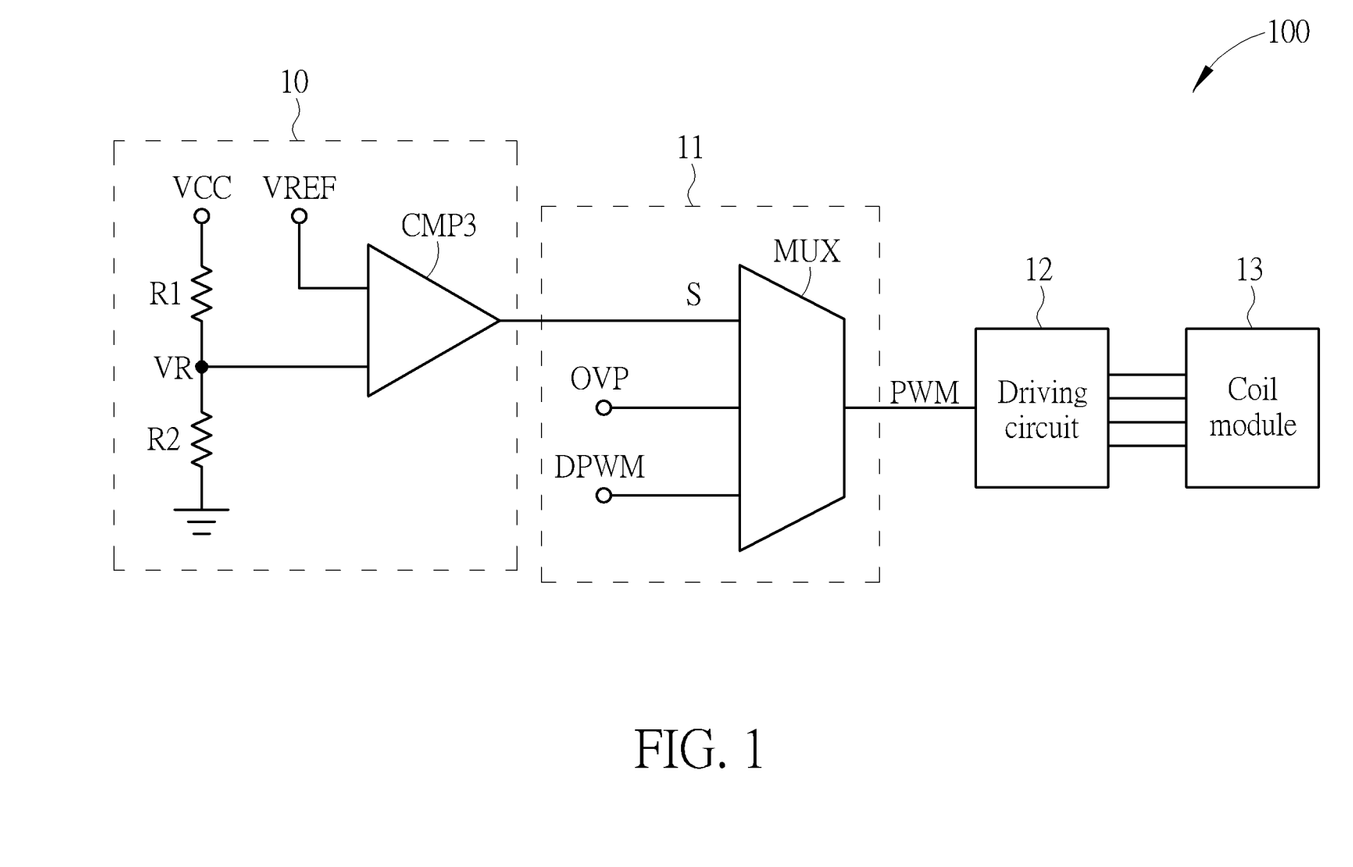
FIG. 1 illustrates a circuit structure of a high voltage protection system according to a first embodiment of the present invention.

FIG. 1 illustrates a circuit structure of a high voltage protection system 100. The high voltage protection system 100 includes a high voltage processing circuit 10, a pulse width modulation signal outputting circuit 11, a driving circuit 12, and a coil module 13. The high voltage processing circuit 10 is used for receiving and processing a high voltage VCC. The pulse width modulation signal outputting circuit 11 is coupled to the high voltage processing circuit 10 for generating a pulse width modulation signal PWM. The driving circuit 12 is coupled to the pulse width modulation signal outputting circuit 11 for receiving the pulse width modulation signal PWM and generating a driving voltage accordingly. The coil module 13 is coupled to the driving circuit 12 and operated according to the driving voltage. In the high voltage protection system 100, the high voltage processing circuit 10 includes a resistor R1, a resistor R2, and a comparator CMP3. The resistor R1 includes a first terminal for receiving the high voltage VCC, and a second terminal. The resistor R2 includes a first terminal coupled to the second terminal of the resistor R1, and a second terminal coupled to a ground terminal. The comparator CMP3 includes a first terminal for receiving a reference voltage VREF, a second terminal coupled to the first terminal of the resistor R2, and an output terminal for outputting a comparison signal S to the pulse width modulation signal outputting circuit 11. An operational mode of the high voltage processing circuit 10 is illustrated below. The high voltage VCC is divided by the resistor R1 and the resistor R2. Then, a divided voltage VR is generated. Afterward, the comparator CMP3 performs to compare the divided voltage VR with the reference voltage VREF (i.e., for example, voltage intensity comparison). When the divided voltage VR is greater than the reference voltage VREF (VR>VREF), the comparator CMP3 outputs the comparison signal S with a first voltage level. On the contrary, when the divided voltage VR is smaller than the reference voltage VREF (VR<VREF), the comparator CMP3 outputs the comparison signal S with a second voltage level. Specifically, the comparison signal S with the first voltage level and the comparison signal S with the second voltage level can be two signals with identical or distinct polarities, such as two bipolar signals or two unipolar signals. The reference voltage VREF can be a system default voltage or a user-defined voltage. The comparison signal S can be received by the pulse width modulation signal outputting circuit 11. In the high voltage protection system 100, the pulse width modulation signal outputting circuit 11 includes a multiplexer MUX. The multiplexer MUX includes a control terminal for receiving the comparison signal S, a first terminal for receiving a first signal OVP, a second terminal for receiving a second signal DPWM, and an output terminal for outputting the pulse width modulation signal PWM to the driving circuit 12. Here, the first signal OVP can be a user-defined pulse width modulation signal, such as a user-defined pulse width modulation signal of over voltage protection fan rotation speed setting (OVP). The second signal DPWM can be a system default pulse width modulation signal. An operational mode of the pulse width modulation signal outputting circuit 11 is illustrated below. When the control terminal of the multiplexer MUX receives the comparison signal S with the first voltage level (VR>VREF), the multiplexer MUX outputs the first signal OVP to the driving circuit 12. In other words, the pulse width modulation signal PWM received by the driving circuit 12 is the first signal OVP. When the control terminal of the multiplexer MUX receives the comparison signal S with the second voltage level (VR<VREF), the multiplexer MUX outputs the second signal DPWM to the driving circuit 12. In other words, the pulse width modulation signal PWM received by the driving circuit 12 is the second signal DPWM. After the driving circuit 12 receives the pulse width modulation signal PWM (i.e., the first signal OVP or the second signal DPWM), the driving circuit 12 generates at least one driving voltage to the coil module 13. Particularly, the at least one driving voltage generated by the driving circuit 12 can be arbitrary voltage type, such as non-differential driving voltages or differential driving voltages. When the coil module 13 is a bridge-based coil module, the driving circuit 12 can generate multi-voltages corresponding to terminals of the coil module 13.

In the high voltage protection system 100, the operational mode of the multiplexer MUX can be controlled according to a comparison result between the divided voltage VR of the high voltage VCC and the reference voltage VREF. Thus, when the high voltage VCC falls within a normally operated voltage interval, a correlation between the divided voltage VR of the high voltage VCC and the reference voltage VREF satisfies a condition as VR<VREF. The multiplexer MUX outputs the second signal DPWM (i.e., the system default pulse width modulation signal). Specifically, the second signal DPWM corresponds to high duty cycle and thus drives the coil module 13 to operate on a high speed status. When the high voltage VCC falls within an abnormally high voltage interval, a correlation between the divided voltage VR of the high voltage VCC and the reference voltage VREF satisfies a condition as VR>VREF. The multiplexer MUX outputs the first signal OVP (i.e., the user-defined pulse width modulation signal). Specifically, the first signal OVP corresponds to low duty cycle and thus drives the coil module 13 to operate on a low speed status. As a result, in the high voltage protection system 100, when the high voltage VCC is detected as an abnormally high voltage, the operational mode of the coil module 13 with low duty cycle can be automatically performed. By doing so, the high voltage protection system 100 is capable of protecting circuit components.

Figure 2:
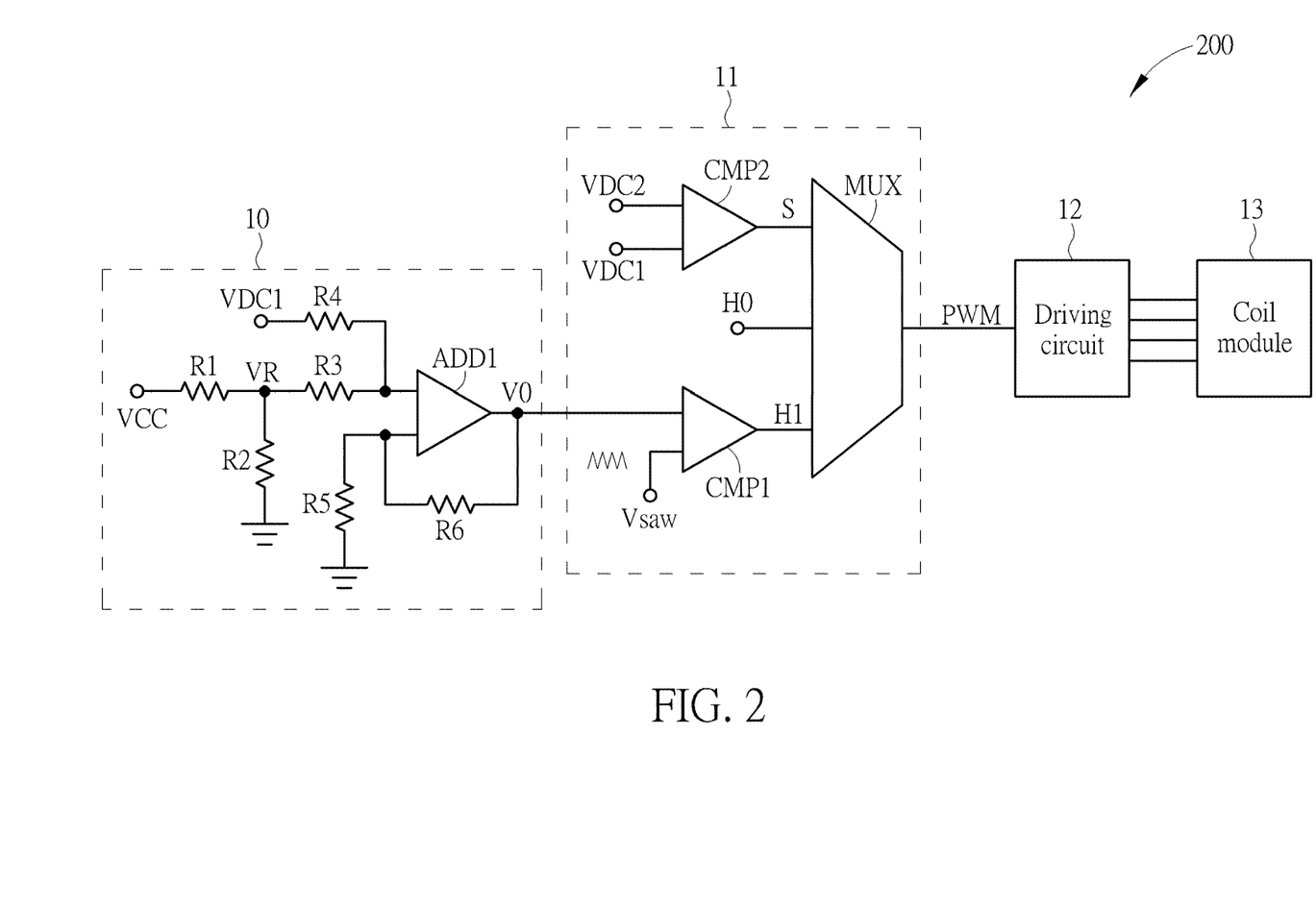
FIG. 2 illustrates a circuit structure of a high voltage protection system according to a second embodiment of the present invention.

FIG. 2 illustrates a circuit structure of a high voltage protection system 200. The high voltage protection system 200 includes a high voltage processing circuit 10, a pulse width modulation signal outputting circuit 11, a driving circuit 12, and a coil module 13. The high voltage processing circuit 10 is used for receiving and processing a high voltage VCC. The pulse width modulation signal outputting circuit 11 is coupled to the high voltage processing circuit 10 for generating a pulse width modulation signal PWM. The driving circuit 12 is coupled to the pulse width modulation signal outputting circuit 11 for receiving the pulse width modulation signal PWM and then generating a driving voltage accordingly. The coil module 13 is coupled to the driving circuit 12 and operated according to the driving voltage. In the high voltage protection system 200, the high voltage processing circuit 10 includes a resistor R1, a resistor R2, a resistor R3, a resistor R4, a resistor R5, a resistor R6, and an adder ADD1. The resistor R1 includes a first terminal for receiving the high voltage VCC, and a second terminal. The resistor R2 includes a first terminal coupled to the second terminal of the resistor R1, and a second terminal coupled to a ground terminal. The resistor R3 includes a first terminal coupled to the first terminal of the resistor R2, and a second terminal. The resistor R4 includes a first terminal for receiving a voltage VDC1 corresponding to a first direct current, and a second terminal coupled to the second terminal of the resistor R3. The resistor R5 includes a first terminal, and a second terminal coupled to a ground terminal. The adder ADD1 includes a first terminal coupled to the second terminal of the resistor R4, a second terminal coupled to the first terminal of the resistor R5, and an output terminal for outputting a cumulative voltage V0 to the pulse width modulation signal outputting circuit 11. The resistor R6 includes a first terminal coupled to the second terminal of the adder ADD1, and a second terminal coupled to the output terminal of the adder ADD1. Specifically, the adder ADD1 can be an inverting summing amplifier. An operational mode of the high voltage processing circuit 10 is illustrated below. The high voltage VCC is divided by the resistor R1 and the resistor R2. Then, a divided voltage VR is generated. Afterward, the divided voltage VR is added to the voltage VDC1 linearly for generating the cumulative voltage V0 through the adder ADD1. A correlation among the divided voltage VR, the voltage VDC1, and the cumulative voltage V0 can be written by $V0=\alpha \times ((\beta \times VR + \gamma \times VDC1)$, wherein a constant $\alpha$ can be equal to $(R5+R6)/R5$, a constant $\beta$ can be equal to $R4/(R3+R4)$, and a constant $\gamma$ can be equal to $R3/(R3+R4)$. In other words, when the high voltage VCC becomes large, the divided voltage VR becomes large accordingly. As a result, the cumulative voltage V0 becomes large. The cumulative voltage V0 is generated from the voltage VDC1 and the divided voltage VR of the high voltage VCC according to a linear correlation. Then, the cumulative voltage V0 is received by the pulse width modulation signal outputting circuit 11. The pulse width modulation signal outputting circuit 11 includes a comparator CMP1, a comparator CMP2, and a multiplexer MUX. The comparator CMP1 includes a first terminal coupled to the output terminal of the adder ADD1 for receiving the cumulative voltage V0, a second terminal for receiving a saw signal Vsaw, and an output terminal for outputting a comparison signal H1. The comparator CMP2 includes a first terminal for receiving the voltage VDC1 corresponding to the first direct current, a second terminal for receiving a voltage VDC2 corresponding to a second direct current, and an output terminal for outputting a comparison signal S. The multiplexer MUX includes a control terminal for receiving the comparison signal S, a first terminal for receiving a predetermined pulse width modulation signal H0, a second terminal for receiving the comparison signal H1, and an output terminal for outputting the pulse width modulation signal PWM to the driving circuit 12. An operational mode of the pulse width modulation signal outputting circuit 11 is illustrated below. In the pulse width modulation signal outputting circuit 11, the voltage VDC1 corresponding to the first direct current and the voltage VDC2 corresponding to the second direct current can be two user-defined voltages. The predetermined pulse width modulation signal H0 can be a user-defined pulse width modulation signal. When the voltage VDC1 is greater than the voltage VDC2 (VDC1>VDC2), the comparator CMP2 outputs the comparison signal S with a first voltage level. When the voltage VDC1 is smaller than the voltage VDC2 (VDC1<VDC2), the comparator CMP2 outputs the comparison signal S with a second voltage level. Specifically, when the control terminal of the multiplexer MUX receives the comparison signal S with the first voltage level (VDC1>VDC2), the multiplexer MUX outputs the comparison signal H1 to the driving circuit 12. In other words, the pulse width modulation signal PWM received by the driving circuit 12 is the comparison signal H1. When the control terminal of the multiplexer MUX receives the comparison signal S with the second voltage level (VDC1<VDC2), the multiplexer MUX outputs the predetermined pulse width modulation signal H0 to the driving circuit 12. In other words, the pulse width modulation signal PWM received by the driving circuit 12 is the predetermined pulse width modulation signal H0. A correlation among the comparison signal H1, the cumulative voltage V0, and the saw signal Vsaw is illustrated later. After the driving circuit 12 receives the pulse width modulation signal PWM (i.e., the predetermined pulse width modulation signal H0 or the comparison signal H1), the driving circuit 12 generates at least one driving voltage to the coil module 13. Particularly, the at least one driving voltage generated by the driving circuit 12 can be arbitrary voltage type, such as non-differential driving voltages or differential driving voltages. When the coil module 13 is a bridge-based coil module, the driving circuit 12 can generate multi-voltages corresponding to terminals of the coil module 13.

For presentation completeness, the correlation among the comparison signal H1, the cumulative voltage V0, and the saw signal Vsaw is illustrated below. As aforementioned illustration, when the high voltage VCC becomes large, the divided voltage VR becomes large accordingly. By invoking the equation as $V0=\alpha \times (\beta \times VR + \gamma \times VDC1)$, the cumulative voltage V0 is increased linearly. Particularly, the cumulative voltage V0 is further compared with the saw signal Vsaw by using the comparator CMP1. The saw signal Vsaw is a deterministic fixed signal. Thus, when the cumulative voltage V0 is increased, time intervals corresponding to the saw signal Vsaw being greater than the cumulative voltage V0 are decreased. As a result, the comparison signal H1 outputting from the comparator CMP1 can be regarded as a pulse width modulation signal. In conclusion, when the high voltage VCC becomes large, pulse width of the comparison signal H1 is decreased. In other words, when the high voltage VCC becomes large, since the saw signal Vsaw is a deterministic signal with two fixed slopes, a correlation between the pulse width of the comparison signal H1 and an intensity of the high voltage VCC is linear. For example, when the high voltage VCC becomes large, the pulse width of the comparison signal H1 is decreased proportionally, leading to low duty cycle of the coil module 13. Additionally, in the high voltage protection system 200, when the high voltage VCC is greater than a threshold value with a very high voltage, the comparator CMP1 may be operated on a saturation status. Thus, the cumulative voltage V0 is bounded to a saturation voltage. In other words, when the high voltage VCC is greater than the threshold value with very high voltage, the comparison signal H1 outputted from the comparator CMP1 has abounded pulse width, leading to very low but fixed duty cycle (or say, idle speed duty cycle) of the coil module 13. As a result, when the high voltage protection system 200 is operated by using the comparison signal H1 and the high voltage VCC is greater than a threshold value with very high voltage, the coil module 13 can be automatically operated on the very low duty cycle status instead of being disabled.

Here, several operational modes are introduced in the high voltage protection system 200. (A) When user configuration satisfies VDC1<VDC2, the multiplexer MUX outputs the predetermined pulse width modulation signal H0 to the driving circuit 12. Thus, the operational mode of the coil module 13 by using user-defined duty cycle can be performed. (B) When user configuration satisfies VDC1>VDC2, the multiplexer MUX outputs the comparison signal H1 to the driving circuit 12. Particularly, the correlation between the pulse width of the comparison signal H1 and the high voltage VCC is linear. When the high voltage VCC becomes large, the pulse width of the comparison signal H1 is decreased. Thus, the operational mode of the coil module 13 by using duty cycle proportional to the high voltage VCC can be performed. (C) When user configuration satisfies VDC1>VDC2 and the high voltage VCC is greater than the threshold value with a very high voltage, the operational mode of the coil module 13 by using very low duty cycle can be performed. By doing so, since the high voltage protection system 200 can select an appropriate duty cycle to drive the coil module 13 automatically or manually according to various intensity of the high voltage VCC, the high voltage protection system 200 is capable of protecting circuit components.

Figure 3:
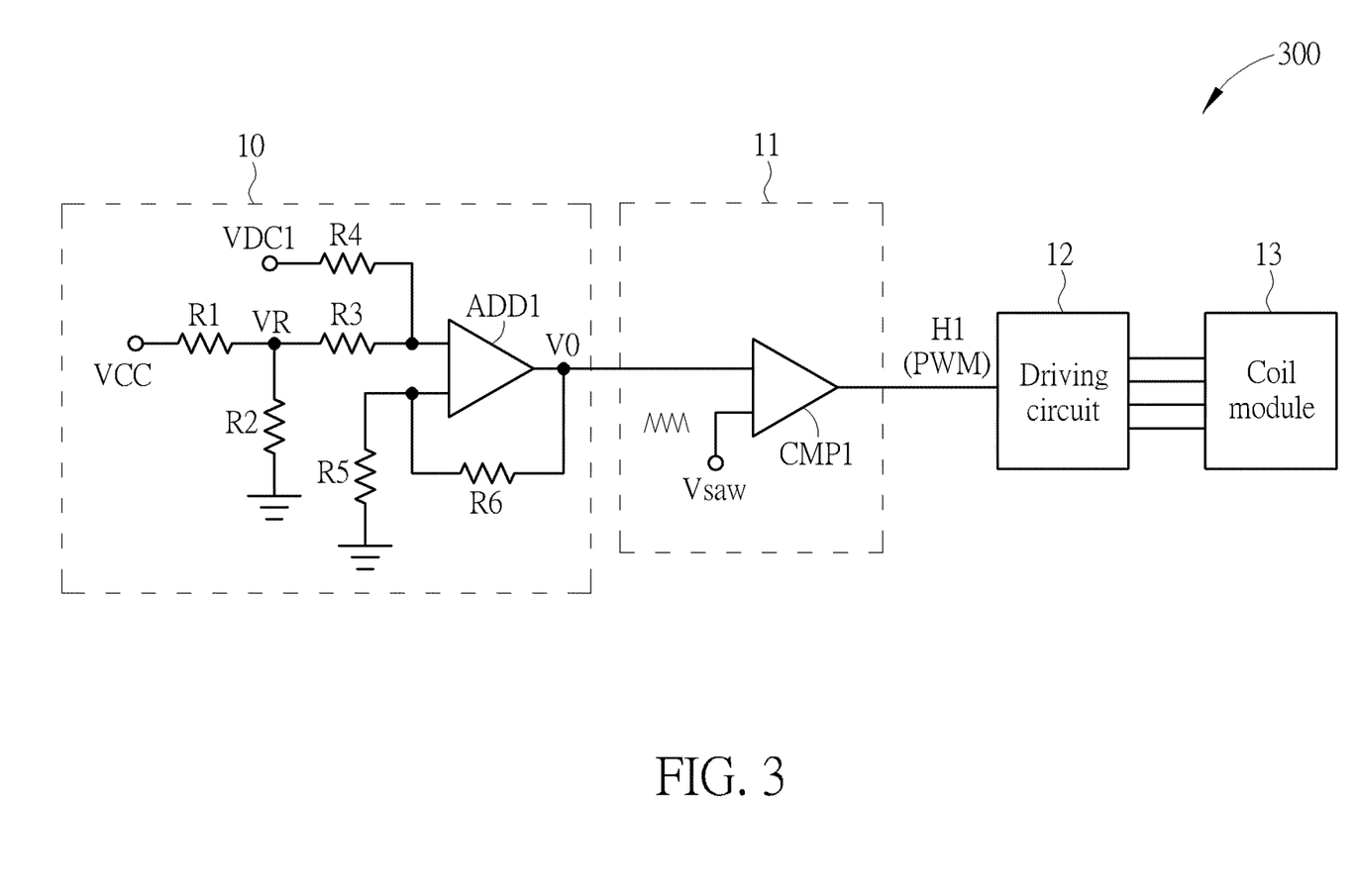
FIG. 3 illustrates a circuit structure of a high voltage protection system according to a third embodiment of the present invention.

FIG. 3 illustrates a circuit structure of a high voltage protection system 300. The high voltage protection system 300 includes a high voltage processing circuit 10, a pulse width modulation signal outputting circuit 11, a driving circuit 12, and a coil module 13. The high voltage processing circuit 10 is used for receiving and processing a high voltage VCC. The pulse width modulation signal outputting circuit 11 is coupled to the high voltage processing circuit 10 for generating a pulse width modulation signal PWM. The driving circuit 12 is coupled to the pulse width modulation signal outputting circuit 11 for receiving the pulse width modulation signal PWM and then generating a driving voltage accordingly. The coil module 13 is coupled to the driving circuit 12 and operated according to the driving voltage. In the high voltage protection system 300, a structure and a function of the high voltage processing circuit 10 is similar to the structure and the function of the high voltage processing circuit 10 in the high voltage protection system 200. Thus, the illustration of the high voltage processing circuit 10 is omitted here. The difference between the pulse width modulation signal outputting circuit 11 in the high voltage protection system 300 and the high voltage protection system 200 is that the pulse width modulation signal outputting circuit 11 in the high voltage protection system 300 lacks the comparator CMP2 and the multiplexer MUX. In other words, the pulse width modulation signal outputting circuit 11 in the high voltage protection system 300 only includes a comparator CMP1. The comparator CMP1 includes a first terminal coupled to the output terminal of the adder ADD1 for receiving a cumulative voltage V0, a second terminal for receiving a saw signal Vsaw, and an output terminal for outputting the pulse width modulation signal (or say, a comparison signal H1) to the driving circuit 12. Here, the comparison signal H1 is regarded as the pulse width modulation signal PWM. After the driving circuit 12 receives the pulse width modulation signal PWM (i.e., the comparison signal H1), the driving circuit 12 generates at least one driving voltage to the coil module 13. Specifically, the high voltage protection system 300 lacks manual operations. Similar to aforementioned operational modes (B) and (C) in the high voltage protection system 200, some operational modes are introduced in the high voltage protection system 300. When the high voltage VCC becomes large, the pulse width of the comparison signal H1 is decreased. Thus, an operational mode of the coil module 13 by using duty cycle proportional to the high voltage VCC can be performed. When the high voltage VCC is greater than a threshold value with a very high voltage, an operational mode of the coil module 13 by using very low duty cycle can be performed. By doing so, since the high voltage protection system 300 can select an appropriate duty cycle to drive the coil module 13 automatically according to various intensity of the high voltage VCC, the high voltage protection system 300 is capable of protecting circuit components.

The aforementioned embodiments of the high voltage protection system 100 to the high voltage protection system 300 can be embedded into an integrated circuit. Without loss of generality, several embodiments of the high voltage protection systems allocated on external circuits are also illustrated below.

Figure 4:
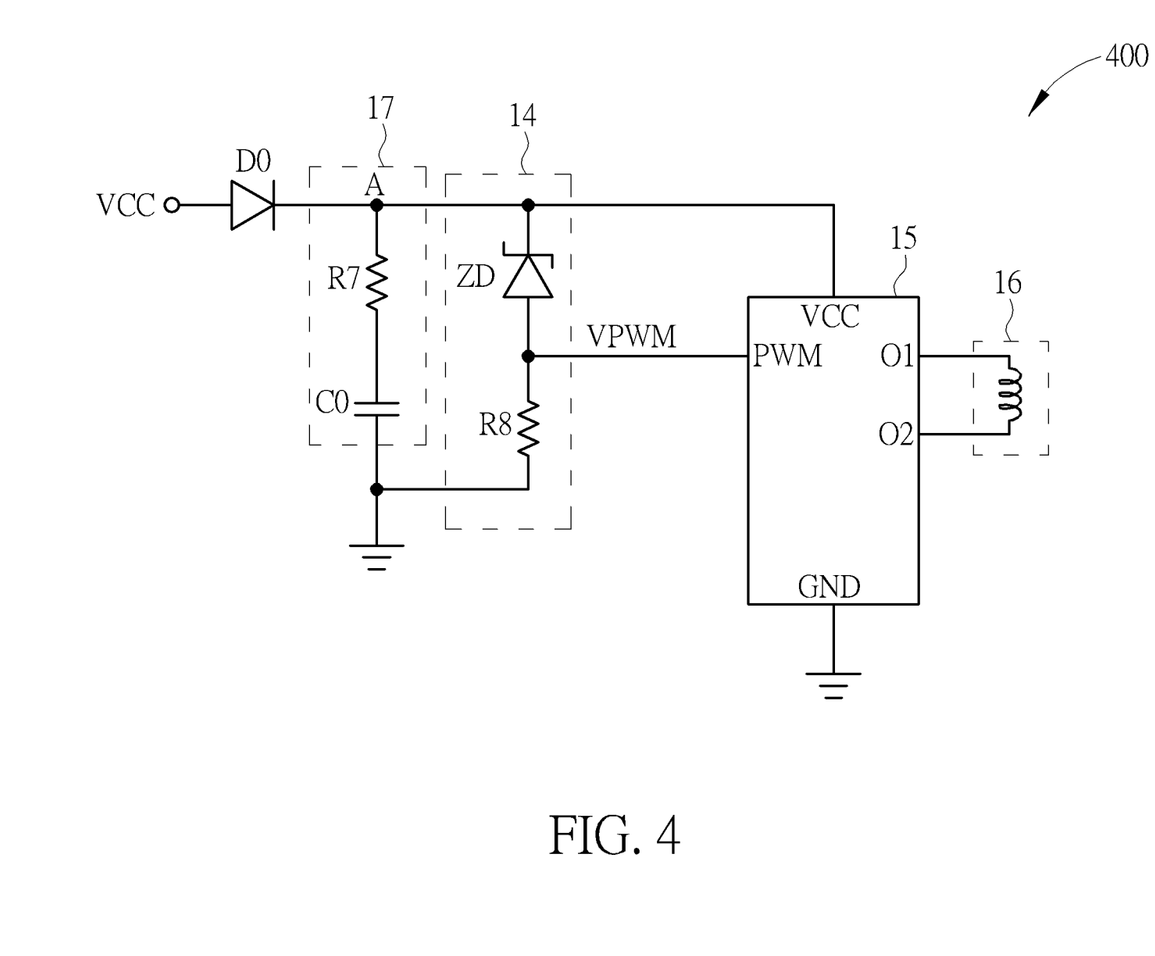
FIG. 4 illustrates a circuit structure of a high voltage protection system according to a fourth embodiment of the present invention.

FIG. 4 illustrates a circuit structure of a high voltage protection system 400. The high voltage protection system 400 includes a high voltage processing circuit 14, a driving chip 15, and a coil module 16. The high voltage processing circuit 14 is used for receiving a high voltage VCC' (i.e., a high voltage VCC' of node A) and generating a pulse width modulation voltage VPWM. The driving chip 15 is coupled to the high voltage processing circuit 14 for generating at least one driving voltage. The coil module 16 is coupled to the driving chip 15 and operated according to the at least one driving voltage. To mitigate spike interference generated from the high voltage VCC', a Snubber circuit 17 can be further introduced in the high voltage protection system 400. The Snubber circuit 17 is coupled to the high voltage processing circuit 14. Particularly, a high voltage VCC of the high voltage protection system 400 can be received by an anode terminal of a diode D0. The cathode terminal of the diode D0 outputs the high voltage VCC'. Specifically, the diode D0 can prevent current inversion. When a current passing through the diode D0 is a forward current, the diode D0 can be regarded as a metal with high conductivity. In other words, when the current passing through the diode D0 is the forward current, an intensity of the high voltage VCC is substantially equal to an intensity of the high voltage VCC'. However, in other embodiments, the diode D0 can be omitted in the high voltage protection system 400. The Snubber circuit 17 includes a resistor R7 and a capacitor C0. The resistor R7 includes a first terminal coupled to the cathode terminal of the diode D0, and a second terminal. The capacitor C0 includes a first terminal coupled to the second terminal of the resistor R7, and a second terminal coupled to the ground terminal. In the embodiment, resistance of the resistor R7 can be smaller than 4.7 Ohm for mitigating the spike interference of the capacitor C0. However, in other embodiments, the Snubber circuit 17 can be omitted. The high voltage processing circuit 14 includes a Zener diode ZD and a resistor R8. The Zener diode ZD includes a cathode terminal for receiving the high voltage VCC', and an anode terminal. The resistor R8 includes a first terminal coupled to the anode terminal of the Zener diode ZD for outputting the pulse width modulation voltage VPWM to the driving chip 15, and a second terminal coupled to the ground terminal. An operational mode of the high voltage processing circuit 14 is illustrated below. When a breakdown voltage of the Zener diode ZD is equal to VZ (i.e., for example, 15V) and a range of the high voltage VCC' (i.e., substantially equal to the high voltage VCC) falls within a normal operated voltage interval, the high voltage VCC' satisfies a condition as VCC'<VZ (15V). Thus, the Zener diode ZD is operated on a forward bias region. The pulse width modulation voltage VPWM is equal to zero. When the breakdown voltage of the Zener diode ZD is equal to VZ (i.e., for example, 15V) and a range of the high voltage VCC' (i.e., substantially equal to the high voltage VCC) falls within an abnormally operated voltage interval, the high voltage VCC' satisfies a condition as VCC'>VZ (15V). Thus, the Zener diode ZD is operated on a breakdown region. The pulse width modulation voltage VPWM is equal to VCC'−VZ. The pulse width modulation voltage VPWM is received by the driving chip 15. The driving chip 15 of the high voltage protection system 400 includes a first terminal coupled to the first terminal of the resistor R8 for receiving the pulse width modulation voltage VPWM, a second terminal coupled to the ground terminal, and output terminals O1 and O2 for outputting driving voltages to the coil module 16. An operational mode of the driving chip 15 is illustrated below. When the pulse width modulation voltage VPWM received by the driving chip 15 is equal to zero (i.e., VCC' is normal), the driving chip 15 outputs driving voltages to the coil module 16 with large duty cycle. Thus, the coil module 16 can be operated at high speed. When the high voltage VCC' is greater than the breakdown voltage VZ of the Zener diode ZD, it implies that the high voltage VCC' is an abnormally high voltage. Thus, the driving chip 15 outputs driving voltages to the coil module 16 with appropriate duty cycle. Specifically, since the pulse width modulation voltage VPWM is proportional to the high voltage terminal VCC' (i.e., VPWM=VCC'−VZ, wherein VZ is regarded as an offset), the operational mode of the coil module 16 by using duty cycle proportional to the high voltage VCC' can be performed. However, in other embodiments, the high voltage protection system can be operated on a very low duty cycle (i.e., idle duty cycle) status. For example, the high voltage processing circuit 14 can use another Zener diode for controlling the driving chip 15 to drive the coil module 16 with a very low duty cycle status when the high voltage VCC' is very large. By doing so, since the high voltage protection system 400 can select an appropriate duty cycle to drive the coil module 16 automatically according to various intensity of the high voltage VCC', the high voltage protection system 400 is capable of protecting circuit components.

Figure 5:
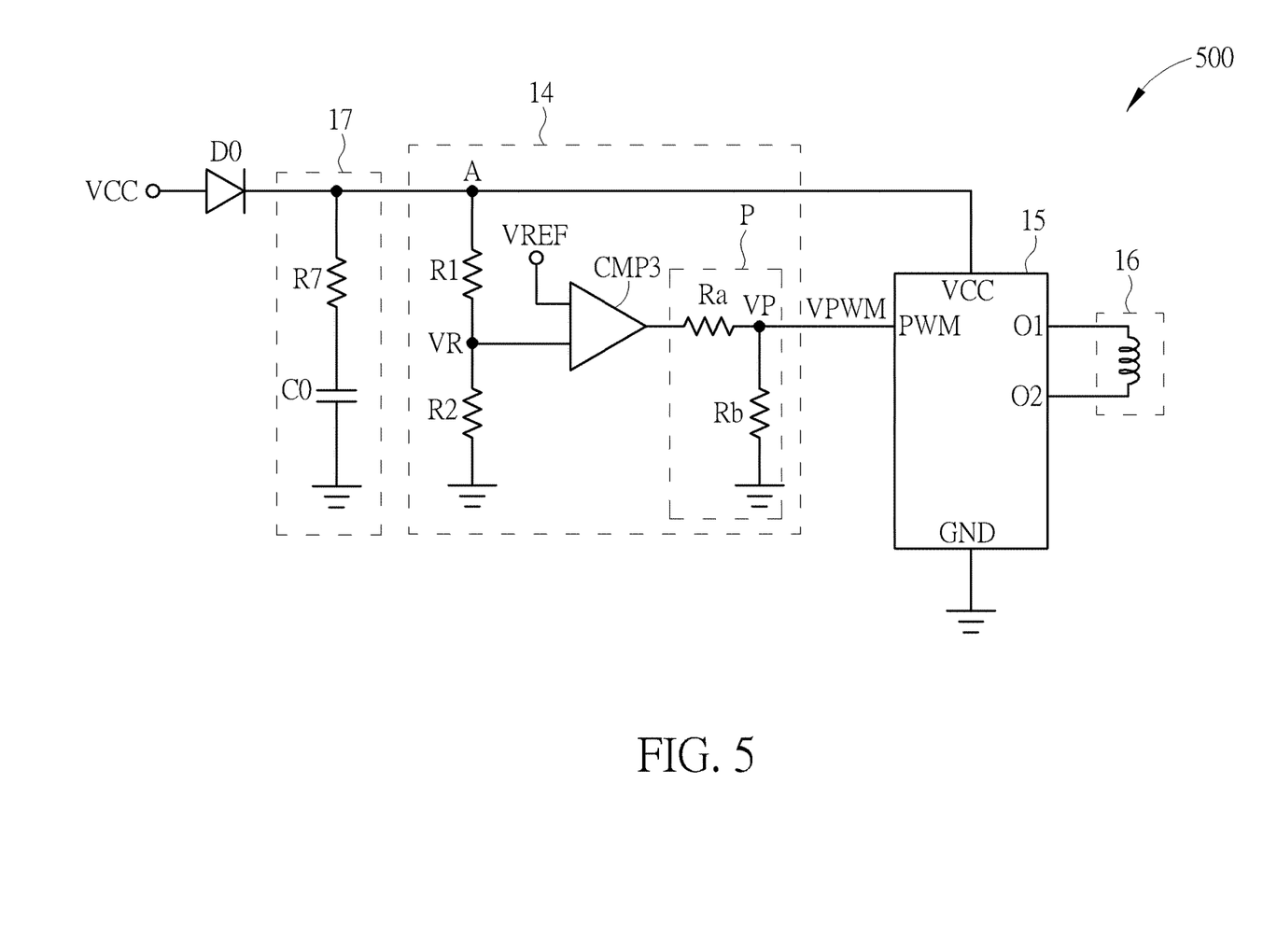
FIG. 5 illustrates a circuit structure of a high voltage protection system according to a fifth embodiment of the present invention.

FIG. 5 illustrates a circuit structure of a high voltage protection system 500. The high voltage protection system 500 includes a high voltage processing circuit 14, a driving chip 15, and a coil module 16. The high voltage processing circuit 14 is used for receiving a high voltage VCC' (i.e., a high voltage VCC' of node A) and generating a pulse width modulation voltage VPWM. The driving chip 15 is coupled to the high voltage processing circuit 14 for generating at least one driving voltage. The coil module 16 is coupled to the driving chip 15 and operated according to the at least one driving voltage. To mitigate spike interference generated from the high voltage VCC', a Snubber circuit 17 can be further introduced in the high voltage protection system 500. The Snubber circuit 17 is coupled to the high voltage processing circuit 14. Particularly, a high voltage VCC of the high voltage protection system 500 can be received by an anode terminal of a diode D0. The cathode terminal of the diode D0 outputs the high voltage VCC'. Specifically, the diode D0 can prevent current inversion. When a current passing through the diode D0 is a forward current, the diode D0 can be regarded as a metal with high conductivity. In other words, when the current passing through the diode D0 is the forward current, an intensity of the high voltage VCC is substantially equal to an intensity of the high voltage VCC'. However, in other embodiments, the diode D0 can be omitted in the high voltage protection system 500. A structure and function of the Snubber circuit 17 in the high voltage protection system 500 is similar to the structure and function of the Snubber circuit 17 in the high voltage protection system 400. Thus, the illustration is omitted here. However, in other embodiments, the Snubber circuit 17 can be omitted. A structure and function of a resistor R1, a resistor R2, and a comparator CMP3 of the high voltage processing circuit 14 is similar to the high voltage processing circuit 10 in the high voltage protection system 100. Thus, the illustration is omitted here. In the embodiment, the high voltage processing circuit 14 further includes a voltage divider P. The voltage divider P is used for adjusting a comparison signal outputted from the comparator CMP3. The voltage divider P includes resistor Ra and resistor Rb. Specifically, resistance of the resistor Ra and resistance of the resistor Rb can be two user-defined values. However, in other embodiments, the voltage divider P can include at least two resistors. In the high voltage protection system 500, since the pulse width modulation voltage VPWM can be adjusted according to various user-defined parameters (i.e., for example, the resistance of the resistor Ra and the resistance of the resistor Rb), when the pulse width modulation voltage VPWM is received by the driving chip 15, the driving chip 15 can drive the coil module 16 by using a user-adjusted duty cycle. Particularly, the driving chip 15 of the high voltage protection system 500 includes a first terminal coupled to the voltage divider P for receiving the pulse width modulation voltage VPWM, a second terminal coupled to the ground terminal, and output terminals O1 and O2 for outputting driving voltages to the coil module 16. An operational mode of the driving chip 15 is illustrated below. First, the comparison signal outputted from the comparator CMP3 becomes a divided voltage VP by using the voltage divider P. The divided voltage VP is regarded as the pulse width modulation voltage VPWM. When the pulse width modulation voltage VPWM with a first voltage level is received by the driving chip 15, it implies that a divided voltage VR of the high voltage VCC' is greater than a reference voltage VREF (VR>VREF). Thus, the driving chip 15 outputs driving voltages to the coil module 16 with low duty cycle. When the pulse width modulation voltage VPWM with a second voltage level is received by the driving chip 15, it implies that a divided voltage VR of the high voltage VCC' is smaller than a reference voltage VREF (VR<VREF). Thus, the driving chip 15 outputs driving voltages to the coil module 16 with high or maximum duty cycle. Particularly, since the voltage divider P is introduced to the high voltage processing circuit 14 of the high voltage protection system 500, two operational modes (i.e., an operational mode by using low duty cycle and an operational mode by using high duty cycle) can be flexibly adjusted by the user. In other words, in the high voltage protection system 500, when the high voltage VCC' is smaller than a predetermined value, the coil module 16 is operated by using high or maximum duty cycle since the high voltage VCC' falls within a normal range of voltage. When the high voltage VCC' is greater than the predetermined value, coil module 16 is operated by using low duty cycle since the high voltage VCC' falls within an abnormal range of voltage. However, in other embodiments, the voltage divider P of the high voltage processing circuit 14 can be omitted. If the voltage divider P is omitted, the first terminal of the driving chip 15 can be coupled to the output terminal of the comparator CMP3. The comparator CMP3 can output the pulse width modulation voltage VPWM to the driving chip 15 directly. Here, two operational modes (i.e., an operational mode by using low duty cycle and an operational mode by using high duty cycle) of the coil module 16 can be performed according to system default parameters. By doing so, since the high voltage protection system 500 can select an appropriate duty cycle to drive the coil module 16 automatically according to various intensity of the high voltage VCC', the high voltage protection system 500 is capable of protecting circuit components.

Figure 6:
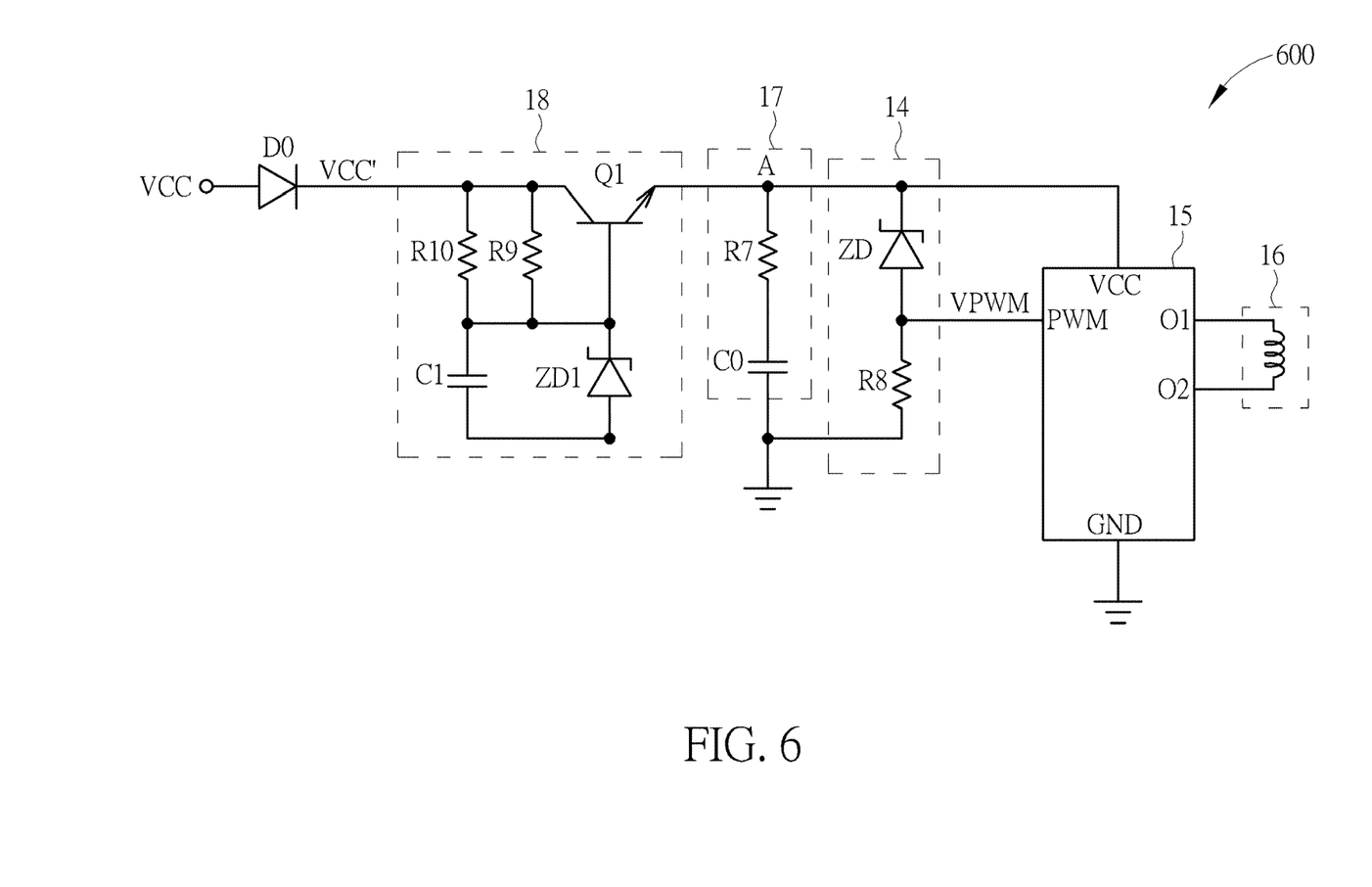
FIG. 6 illustrates a circuit structure of a high voltage protection system according to a sixth embodiment of the present invention.

FIG. 6 illustrates a circuit structure of a high voltage protection system 600. The high voltage protection system 600 includes a voltage regulator 18, a high voltage processing circuit 14, a driving chip 15, and a coil module 16. The voltage regulator 18 is used for receiving a high voltage VCC'. Then, the voltage regulator 18 generates a step-down high voltage VCCA (i.e., a voltage of node A) by reducing an intensity of the high voltage VCC'. The high voltage processing circuit 14 is coupled to the voltage regulator 18 for receiving and processing the step-down high voltage VCCA (i.e., the voltage of node A). After the step-down high voltage VCCA is processed, the high voltage processing circuit 14 generates a pulse width modulation voltage VPWM. The driving chip 15 is coupled to the high voltage processing circuit 14 for generating at least one driving voltage. The coil module 16 is coupled to the driving chip 15 and operated according to the at least one driving voltage. To mitigate spike interference generated from the step-down high voltage VCCA, a Snubber circuit 17 can be further introduced in the high voltage protection system 600. The Snubber circuit 17 is coupled to the high voltage processing circuit 14. Particularly, a high voltage VCC of the high voltage protection system 600 can be received by an anode terminal of a diode D0. The cathode terminal of the diode D0 outputs the high voltage VCC'. Specifically, the diode D0 can prevent current inversion. When a current passing through the diode D0 is a forward current, the diode D0 can be regarded as a metal with high conductivity. In other words, when the current passing through the diode D0 is the forward current, an intensity of the high voltage VCC is substantially equal to an intensity of the high voltage VCC'. However, in other embodiments, the diode D0 can be omitted in the high voltage protection system 600. A structure and function of the Snubber circuit 17 in the high voltage protection system 600 is similar to the structure and function of the Snubber circuit 17 in the high voltage protection system 400. Thus, the illustration is omitted here. However, in other embodiments, the Snubber circuit 17 can be omitted. A structure and function of the high voltage processing circuit 14 in the high voltage protection system 600 is similar to the structure and function of the high voltage processing circuit 14 in the high voltage protection system 400. Thus, the illustration is also omitted here. A structure and function of the driving circuit 15 in the high voltage protection system 600 is similar to the structure and function of the driving circuit 15 in the high voltage protection system 400. Thus, the illustration is also omitted here. In the high voltage protection system 600, the voltage regulator 18 includes a resistor R9, a resistor R10, an NPN-type triode Q1, a capacitor C1, and a Zener diode ZD1. However, the structure of the voltage regulator 18 is not limited to the illustration in FIG. 6. Any circuit capable of stabilizing voltage can be applied to the high voltage protection system 600. As known, each circuit component in the voltage protection system 600 has a corresponding maximum tolerable voltage. When the high voltage VCC is an extremely high voltage, the high voltage VCC may exceed the maximum tolerable voltage, leading to disability of all circuit components. Thus, the high voltage protection system 600 may lose a capability of protecting circuit components. Thus, when the high voltage VCC is considered as the extremely high voltage, the voltage regulator 18 is necessary and essential.

For presentation simplicity, an example is introduced to illustrate an operation of the high voltage protection system 600. Here, the tolerable voltage of the circuit components is assumed as 18 volts. A breakdown voltage of the Zener diode ZD1 of the voltage regulator 18 is chosen as 16 volts. Thus, the high voltage VCC (i.e., for example, 27V) can be decreased to 16 volts (or smaller than 16V) by using the voltage regulator 18. In other words, the step-down high voltage VCCA of the node A is smaller than 16 volts. However, when the step-down high voltage VCCA (16V) is still regarded as an abnormal voltage for the coil module 16, a breakdown voltage of the Zener diode ZD can be chosen as 14 volts to protect the coil module 16. Briefly, the high voltage VCC is firstly reduced to the step-down high voltage VCCA by the voltage regulator 18. The step-down high voltage VCCA is small enough so that all the circuit components are ensured to operate continuously. However, when the step-down high voltage VCCA is smaller than the breakdown voltage of the Zener diode ZD, the driving circuit 15 drives the coil module 16 in high or maximum speed (duty cycle). When the step-down high voltage VCCA is greater than the breakdown voltage of the Zener diode ZD, the duty cycle proportional to the step-down high voltage VCCA can be applied to the coil module 16. Similar to the high voltage protection system 400, since the high voltage protection system 600 can select an appropriate duty cycle to drive the coil module 16 automatically according to various intensity of the step-down high voltage VCCA, the high voltage protection system 600 is capable of protecting circuit components. Additionally, since the voltage regulator 18 is introduced to the high voltage protection system 600, the high voltage protection system 600 can avoid circuit disability when an extremely high voltage VCC is received. Further, volume requirement of the triode Q1 can be reduced because of the utilization of the voltage regulator 18 and the high voltage processing circuit 14.

In the high voltage protection systems 400, 500, and 600, when the driving circuit 15 receives the pulse width modulation voltage VPWM, the driving circuit 15 can generate the corresponding at least one driving voltage to drive the coil module 16 according to a logic circuit, a polynomial circuit, or a query table integrated inside the driving circuit 15. In a broad sense, any driving circuit 15 with capability of transforming the pulse width modulation voltage VPWM to the driving voltages belongs to the scope of the present invention.

To sum up, the present invention discloses various high voltage protection systems. The high voltage protection systems can protect circuit components when an abnormally high voltage is received. Several operational modes with respect to the high voltage protection systems are also illustrated. (A) When the abnormally high voltage is received, a coil module is operated by using a user-defined duty cycle. (B) When the abnormally high voltage is received, the coil module is operated by using a duty cycle proportional to the high voltage. (C) When the abnormally high voltage is received, a coil module is operated by using a very low duty cycle. (D) When the extremely high voltage is received, the voltage regulator 18 decreases the extremely high voltage first for protecting the circuit components. Then, the coil module is operated on an appropriate operational mode according to a step-down high voltage. As a result, in the high voltage protection systems, when the abnormally high voltage is received, the coil module maintains the operation by using the appropriate duty cycle. Thus, the driving stage can be protected from burnout or being damaged when a massive power (i.e., caused by abnormally/extremely high voltage) is occurred. Particularly, for example, when the voltage protection systems are considered as fan systems, the conventional voltage protection systems may directly disable a power source (or the coil module) for protecting circuit components, thereby leading to damage of device (i.e., CPU) which needs to dissipate heat since the function of heat dissipation is also paused. As a result, since the coil module of the present invention maintains the operation by using the appropriate duty cycle at any moment, the operational modes of the high voltage protection systems in the present invention provide greater range of permissible voltage, satisfactory adaptability, high operation flexibility and reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage protection system, comprising:
  a high voltage processing circuit configured to receive and processes a high voltage, comprising:
    a first resistor comprising:
      a first terminal configured to receive the high voltage; and
      a second terminal;
    a second resistor comprising:
      a first terminal coupled to the second terminal of the first resistor; and
      a second terminal coupled to a ground terminal;
    a third resistor comprising:
      a first terminal coupled to the first terminal of the second resistor; and
      a second terminal;
    a fourth resistor comprising:
      a first terminal configured to receive a voltage corresponding to a first direct current; and
      a second terminal coupled to the second terminal of the third resistor;
    a fifth resistor comprising:
      a first terminal; and
      a second terminal coupled to a ground terminal;
    an adder comprising:
      a first terminal coupled to the second terminal of the fourth resistor;
      a second terminal coupled to the first terminal of the fifth resistor; and
      an output terminal configured to output a cumulative voltage to a pulse width modulation signal outputting circuit; and
    a sixth resistor comprising:
      a first terminal coupled to the second terminal of the adder; and
      a second terminal coupled to the output terminal of the adder;
  the pulse width modulation signal outputting circuit coupled to the high voltage processing circuit and configured to generate a pulse width modulation signal;
  a driving circuit coupled to the pulse width modulation signal outputting circuit and configured to receive the pulse width modulation signal and generate a driving voltage accordingly; and
  a coil module coupled to the driving circuit and operated according to the driving voltage;
  wherein the pulse width modulation signal outputting circuit generates the pulse width modulation signal to protect the coil module according to an intensity of the high voltage through the high voltage processing circuit.

2. The system of claim 1, wherein the pulse width modulation signal outputting circuit comprises:
  a multiplexer comprising:
    a control terminal configured to receive a comparison signal;
    a first terminal configured to receive a first signal;
    a second terminal configured to receive a second signal;
    an output terminal configured to output the pulse width modulation signal to the driving circuit; and
  wherein the first signal is a user-defined pulse width modulation signal, the second signal is a system default pulse width modulation signal, when a correlation between the reference voltage and the comparison signal satisfies a first condition, the pulse width modulation signal is the first signal, when the correlation between the reference voltage and the comparison signal satisfies a second condition, the pulse width modulation signal is the second signal.

3. The system of claim 1, wherein the pulse width modulation signal outputting circuit comprises:
  a first comparator comprising:
    a first terminal coupled to the output terminal of the adder and configured to receive the cumulative voltage;
    a second terminal configured to receive a saw signal; and
    an output terminal configured to output the pulse width modulation signal to the driving circuit; and
  wherein the cumulative voltage is generated from the voltage corresponding to the first direct current and the high voltage according to a linear correlation, and a correlation between a pulse width of the pulse width modulation signal and an intensity of the cumulative voltage is linear.

4. The system of claim 1, wherein the pulse width modulation signal outputting circuit comprises:
  a first comparator comprising:
    a first terminal coupled to the output terminal of the adder and configured to receive the cumulative voltage;
    a second terminal configured to receive a saw signal; and
    an output terminal configured to output a first comparison signal;
  a second comparator comprising:
    a first terminal configured to receive the voltage corresponding to the first direct current;
    a second terminal configured to receive a voltage corresponding to a second direct current; and
    an output terminal configured to output a second comparison signal; and
  a multiplexer comprising:

a control terminal configured to receive the second comparison signal;
a first terminal configured to receive a predetermined pulse width modulation signal;
a second terminal configured to receive the first comparison signal; and
an output terminal configured to output the pulse width modulation signal to the driving circuit; and
wherein the cumulative voltage is generated from the voltage corresponding to the first direct current and the high voltage according to a linear correlation, when the voltage corresponding to the first direct current is smaller than the voltage corresponding to the second direct current, the multiplexer selects to output the predetermined pulse width modulation signal as the pulse width modulation signal to the driving circuit, and when the voltage corresponding to the first direct current is greater than the voltage corresponding to the second direct current, the multiplexer selects to output the first comparison signal as the pulse width modulation signal to the driving circuit.

5. A high voltage protection system, comprising:
a high voltage processing circuit configured to receive a high voltage and generate a pulse width modulation voltage, comprising:
   a Zener diode comprising:
      a cathode terminal configured to receive a high voltage; and
      an anode terminal; and
   a first resistor comprising:
      a first terminal coupled to the anode terminal of the Zener diode and configured to output the pulse width modulation voltage to a driving chip; and
      a second terminal coupled to a ground terminal;
the driving chip coupled to the high voltage processing circuit and configured to generate at least one driving voltage, comprising:
   a first terminal coupled to the first terminal of the first resistor and configured to receive the pulse width modulation voltage;
   a second terminal coupled to the ground terminal; and
   at least one output terminal configured to output the at least one driving voltage to a coil module; and
the coil module coupled to the driving chip and operated according to the at least one driving voltage;
wherein when the high voltage is smaller than a breakdown voltage of the Zener diode, the Zener diode is operated on a forward bias region so that the pulse width modulation voltage outputted from the high voltage processing circuit is constant for controlling a duty cycle of the coil module under a normal condition, when the high voltage is greater than the breakdown voltage of the Zener diode, the Zener diode is operated on a breakdown region so that the pulse width modulation voltage outputted from the high voltage processing circuit is used for linearly controlling a duty cycle of the coil module, and the driving chip generates the least one driving voltage to protect the coil module according to an intensity of the high voltage through the high voltage processing circuit.

6. The system of claim 5, further comprising:
a diode comprising:
   an anode terminal; and
   a cathode terminal coupled to the cathode terminal of the Zener diode;
a Snubber circuit coupled to the high voltage processing circuit, the Snubber circuit comprising:
   a third resistor comprising:
      a first terminal coupled to the cathode terminal of the Zener diode; and
      a second terminal; and
   a capacitor comprising:
      a first terminal coupled to the second terminal of the third resistor; and
      a second terminal coupled to the ground terminal;
wherein the Snubber circuit reduces a spike interference generated from the high voltage.

7. A high voltage protection system, comprising:
a voltage regulator configured to receive a high voltage and generate a step-down high voltage by reducing an intensity of the high voltage;
a high voltage processing circuit coupled to the voltage regulator and configured to receive and process the step-down high voltage and generate a pulse width modulation voltage, comprising:
   a Zener diode comprising:
      a cathode terminal coupled to the voltage regulator and configured to receive the step-down high voltage; and
      an anode terminal; and
   a first resistor comprising:
      a first terminal coupled to the anode terminal of the Zener diode and configured to output the pulse width modulation voltage to a driving chip; and
      a second terminal coupled to a ground terminal;
the driving chip coupled to the high voltage processing circuit and configured to generate at least one driving voltage, comprising:
   a first terminal coupled to the first terminal of the first resistor and configured to receive the pulse width modulation voltage;
   a second terminal coupled to the ground terminal; and
   at least one output terminal configured to output the at least one driving voltage to a coil module; and
the coil module coupled to the driving chip and operated according to the at least one driving voltage;
wherein when the step-down high voltage is smaller than a breakdown voltage of the Zener diode, the Zener diode is operated on a forward bias region so that the pulse width modulation voltage outputted from the high voltage processing circuit is constant for controlling a duty cycle of the coil module under a normal condition, when the step-down high voltage is greater than the breakdown voltage of the Zener diode, the Zener diode is operated on a breakdown region so that the pulse width modulation voltage outputted from the high voltage processing circuit is used for linearly controlling a duty cycle of the coil module, and the driving chip generates the at least one driving voltage to protect the coil module according to the intensity of the high voltage through the voltage regulator and the high voltage processing circuit.

* * * * *